(12) United States Patent
Waki et al.

(10) Patent No.: US 8,502,712 B2
(45) Date of Patent: Aug. 6, 2013

(54) ANALOGUE TO DIGITAL CONVERTER AND SIGNAL PROCESSING SYSTEM

(75) Inventors: Naoya Waki, Yokohama (JP); Junya Matsuno, Kawasaki (JP); Takafumi Yamaji, Yokohama (JP); Masanori Furuta, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/425,317

(22) Filed: Mar. 20, 2012

(65) Prior Publication Data
US 2013/0076544 A1 Mar. 28, 2013

(30) Foreign Application Priority Data
Sep. 26, 2011 (JP) ................. 2011-209491

(51) Int. Cl.
*H03M 1/06* (2006.01)
(52) U.S. Cl.
USPC .......................... 341/118; 341/120
(58) Field of Classification Search
USPC ............. 341/118, 120, 155, 159; 375/232, 375/316, 350
See application file for complete search history.

(56) References Cited

U.S. PATENT DOCUMENTS

| 7,084,793 B2 | 8/2006 | Elbornsson | |
|---|---|---|---|
| 7,839,323 B2 * | 11/2010 | Kidambi | 342/118 |
| 2007/0171116 A1 | 7/2007 | Fuse et al. | |

FOREIGN PATENT DOCUMENTS
WO WO 2006/075505 7/2006

OTHER PUBLICATIONS

Oshima et al., "LMS calibration of sampling timing for time-interleaved A/D converters," Electronics Letters, 2009, 2 pages, vol. 45—No. 12.
Oshima et al., "On-chip background calibration of time-interleaved ADC," IEICE Technical Report ICD2010-34, 2010, pp. 79-84.
Toshiba, Background Art Information, Nov. 8-Dec. 15, 2011.

* cited by examiner

*Primary Examiner* — Joseph Lauture
(74) *Attorney, Agent, or Firm* — Knobbe, Martens, Olson & Bear, LLP

(57) ABSTRACT

According to one embodiment, an analogue to digital converter converts an analogue input signal to a digital output signal. The converter includes an analogue to digital converting unit, a multiplexer, a pseudo-alias signal generator, a gain controller, and an alias signal compensator. The analogue to digital converting unit converts the analogue input signal to a plurality of digital signals. The multiplexer sequentially selects one of the digital signals and outputs the selected digital signal as a multiplexer output. The pseudo-alias signal generator generates a plurality of pseudo-alias signals from the digital signals. The pseudo-alias signal simulates an alias signal component in the multiplexer output. The gain controller generates a plurality of gain control signals by using the pseudo-alias signals. The gain control signal controls gain of the digital output signal. The alias signal compensator compensates the alias signal component by using the gain control signals.

20 Claims, 10 Drawing Sheets

ANALOGUE TO DIGITAL CONVERTER AND SIGNAL PROCESSING SYSTEM

CROSS REFERENCE TO RELATED APPLICATION(S)

This application is based upon and claims the benefit of priority from the prior Japanese Patent Application No. 2011-209491, filed on Sep. 26, 2011, the entire contents of which are incorporated herein by reference.

FIELD

Embodiments described herein relate generally to an analogue to digital converter and a signal processing system.

BACKGROUND

Conventionally, a signal processing system has a TI-ADC (time-interleaved analogue digital converter), an ADC (analogue-to-digital converter), and a correction processor. The correction processor estimates an error to be corrected by using the steepest descent method of the covariance norm and corrects an error caused by mismatch between interleaves by using the estimation result and an adaptive filter.

However, since the adaptive filter is large-scale, the size of the correction processor is extremely large, and a process amount necessary to correct an error caused by mismatch between interleaves is extremely large. As a result, it is difficult to realize small size and high speed of the TI-ADC.

DETAILED DESCRIPTION

Embodiments will now be explained with reference to the accompanying drawings.

In general, according to one embodiment, an analogue to digital converter converts an analogue input signal to a digital output signal. The converter includes an analogue to digital converting unit, a multiplexer, a pseudo-alias signal generator, a gain controller, and an alias signal compensator. The analogue to digital converting unit converts the analogue input signal to a plurality of digital signals. The multiplexer sequentially selects one of the digital signals and outputs the selected digital signal as a multiplexer output. The pseudo-alias signal generator generates a plurality of pseudo-alias signals from the digital signals. The pseudo-alias signal simulates an alias signal component in the multiplexer output. The gain controller generates a plurality of gain control signals by using the pseudo-alias signals. The gain control signal controls gain of the digital output signal. The alias signal compensator compensates the alias signal component by using the gain control signals.

(First Embodiment)

A first embodiment will be described. In the first embodiment, an example of correcting an alias signal component by a small-scale circuit will be described.

Figure 1:
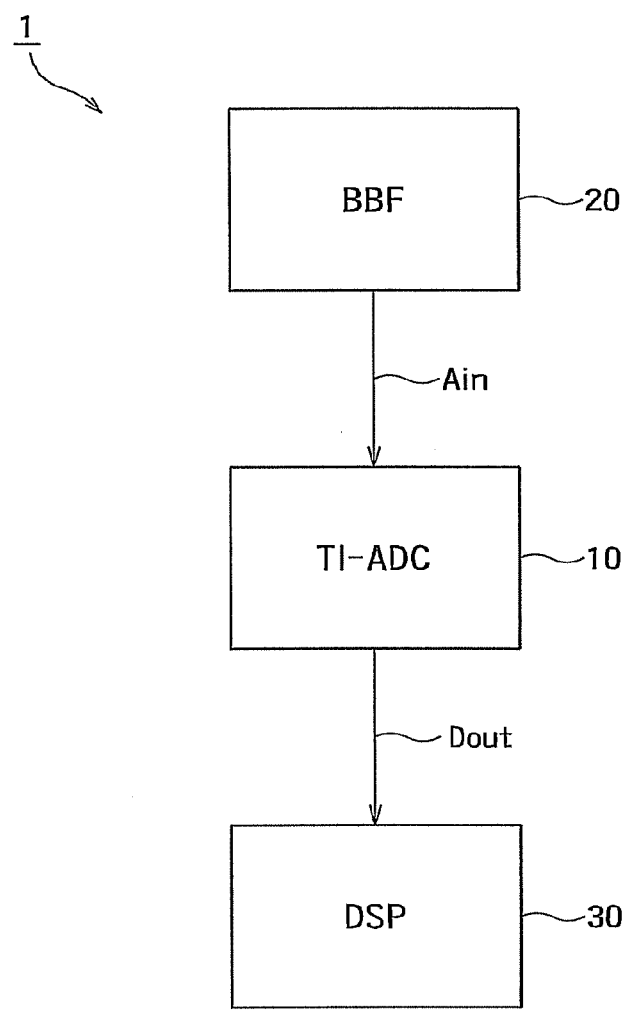
FIG. 1 is a block diagram illustrating the configuration of the signal processing system 1 of the first embodiment.

The configuration of a signal processing system 1 of the first embodiment will be described. FIG. 1 is a block diagram illustrating the configuration of the signal processing system 1 of the first embodiment.

As shown in FIG. 1, the signal processing system 1 has a BBF (base band filter) 20, a TI-ADC (time-interleaved analogue digital converter) 10, and a DSP (digital signal processor) 30. For example, the signal processing system 1 is provided in a tuner processing a radio signal transmitted from a broadcast station of digital television broadcast.

The BBF 20 filters a radio signal supplied from the outside (for example, a broadcast station of digital television broadcasting) of the signal processing system 1 and generates an analogue input signal Ain.

The TI-ADC 10 converts the analogue input signal Ain to a digital output signal Dout by the time-interleaved method.

The DSP 30 performs predetermined signal process on the digital output signal Dout. For example, in the case where the analogue input signal Ain is obtained from a digital television signal transmitted from a broadcast station, the DSP 30 generates data of a television program from the digital output signal Dout.

Figure 2:
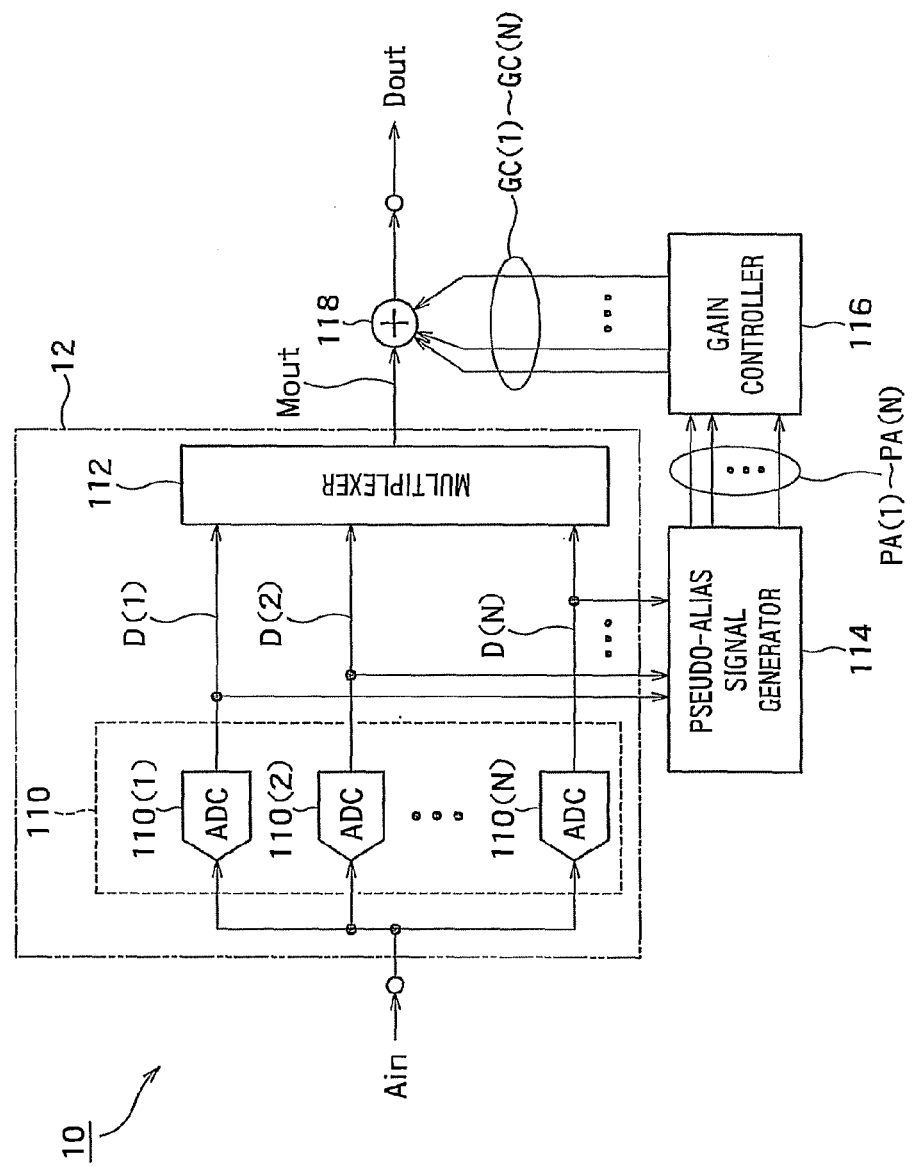
FIG. 2 is a schematic diagram illustrating the configuration of the TI-ADC 10 of the first embodiment.

The configuration of the TI-ADC 10 of the first embodiment will be described. FIG. 2 is a schematic diagram illustrating the configuration of the TI-ADC 10 of the first embodiment.

As illustrated in FIG. 2, the TI-ADC 10 has an analogue-to-digital converting unit 12 (including an analogue-to-digital converter 110 and a multiplexer 112), a pseudo-alias signal generator 114, a gain controller 116, and an alias signal compensator 118.

The analogue-to-digital converter 110 converts the analogue input signal Ain to N pieces (N is an integer of 2 or larger) of digital signals D(1) to D(N). For example, the analogue-to-digital converter 110 has N pieces of ADCs (analogue-to-digital converters) 110(1) to 110(N). The operation frequency of the ADCs 110(1) to 110(N) is 1/N of sample frequency Fs (that is, the operation frequency thereof is Fs/N). The phase difference $\Delta P$ between phase P(n) of a digital signal D(n) outputted from an ADC 110(n) (n is 1 to N)) and phase P(n+1) of a digital signal D(n+1) outputted from an ADC 110(n+1) is $2\pi/N$.

The multiplexer 112 sequentially selects one digital signal D(n) from the N pieces of digital signals D(1) to D(N) at intervals of sample cycle Ts (Ts=1/Fs) of the sample frequency Fs and outputs the selected digital signal D(n) as a multiplexer output Mout. The multiplexer output Mout changes every sample cycle Ts. In the case where there is a mismatch between interleaves such as a gain error or skew, a digital signal component and an alias signal component are mixed in the multiplexer output Mout. The digital signal component is a signal component necessary for a signal process performed by the DSP 30 whereas the alias signal component is a signal component unnecessary for the signal process performed by the DSP 30.

The pseudo-alias signal generator 114 generates N pieces of pseudo-alias signals PA(1) to PA(N) from the N pieces of digital signals D(1) to D(N). The pseudo-alias signal PA(n) simulates an alias signal component included in the multiplexer output Mout. For example, the pseudo-alias signal generator 114 is an orthogonal transformer. Preferably, the pseudo-alias signal generator 114 is a Hadamard transformer.

The gain controller 116 generates N pieces of gain control signals GC(1) to GC(N) by using the N pieces of pseudo-alias signals PA(1) to PA(N). The gain control signal GC(n) is a signal for controlling the gain of the digital output signal Dout so that the alias signal component included in the multiplexer output Mout is eliminated.

The alias signal compensator 118 is provided at a post stage of the multiplexer 112. The alias signal compensator 118 compensates the alias signal component included in the multiplexer output Mout by using the N pieces of gain control signals GC(1) to GC(N) and the multiplexer output Mout. For example, the alias signal compensator 118 compensates the alias signal component included in the multiplexer output Mout by adding the gain control signals GC(1) to GC(N) to the multiplexer output Mout. Thereby, the digital output signal Dout which does not include alias signal component is obtained. A digital output signal Dout[x] at arbitrary time obtained by the alias signal compensator 118 is expressed by equation (1). In the equation (1), x denotes a sample sequence, Mout[x] denotes a multiplexer output, and GC(n)[x] denotes a signal level of the gain control signal GC(n).

$$Dout[x] = Mout[x] + \sum_{n=1}^{N} GC(n)[x] \quad \text{Equation (1)}$$

According to the first embodiment, the pseudo-alias signal generator 114, the gain controller 116, and the alias signal compensator 118 perform processes on the alias signal component having a signal level lower than that of the digital signal component. Therefore, the circuit scale and the process amount of the pseudo-alias signal generator 114, the gain controller 116, and the alias signal compensator 118 are smaller than those of modules used in the conventional signal processing system. As a result, the size of the TI-ADC 10 can be reduced, and the process amount necessary to compensate an error caused by a mismatch between interleaves can be reduced.

Particularly, by using a Hadamard converter as the pseudo-alias signal generator 114, the circuit scale of the pseudo-alias signal generator 114 can be further reduced.

(Second Embodiment)

A second embodiment will be described. In the second embodiment, an example of separately generating a pseudo-alias signal used for compensating an alias signal (first alias signal) component corresponding to a gain error and a pseudo alias signal used for compensating an alias signal component (second alias signal) corresponding to a skew will be described. The description similar to the foregoing embodiment will not be repeated.

Figure 3:
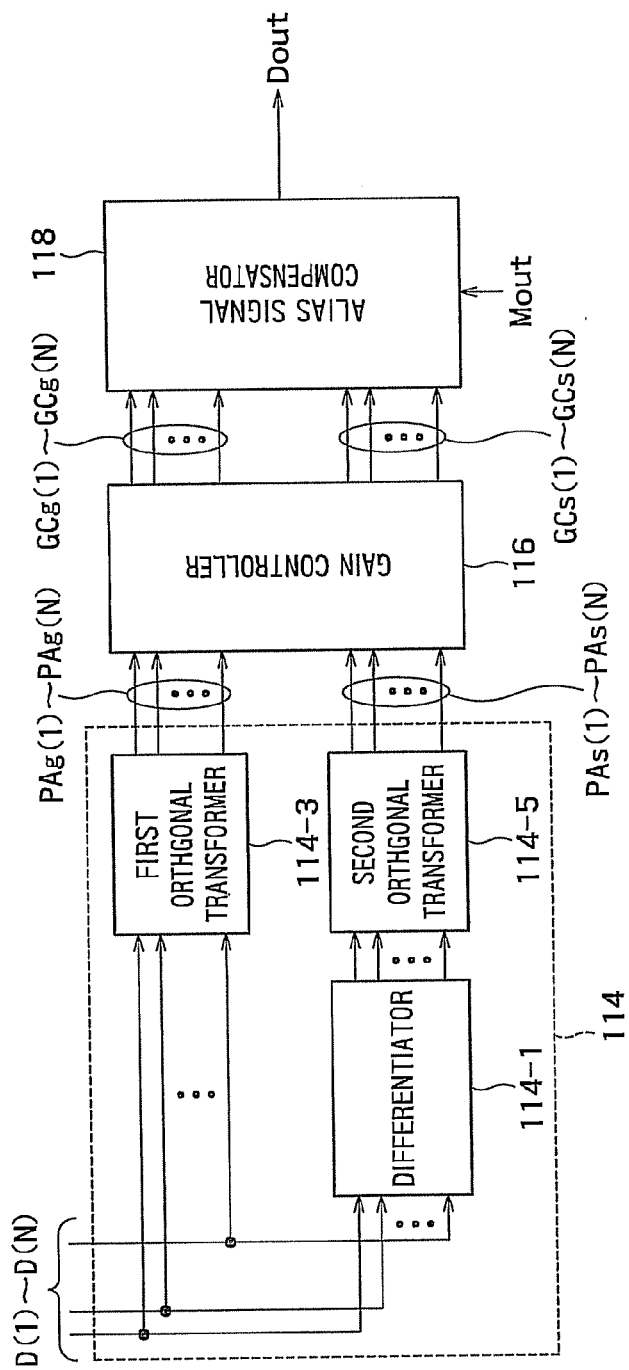
FIG. 3 is a block diagram for explaining the pseudo-alias signal generator 114, the gain controller 116, and the alias signal compensator 118 of the second embodiment.

The configuration of the pseudo-alias signal generator 114 of the second embodiment will be described. FIG. 3 is a block diagram for explaining the pseudo-alias signal generator 114, the gain controller 116, and the alias signal compensator 118 of the second embodiment.

As shown in FIG. 3, the pseudo-alias signal generator 114 has a differentiator 114-1, a first orthogonal transformer 114-3, and a second orthogonal transformer 114-5. The pseudo-alias signal generator 114 is provided with a first orthogonal transform path and a second orthogonal transform path.

In the first orthogonal transform path, the N pieces of digital signals D(1) to D(N) pass through the first orthogonal transformer 114-3 without passing through the differentiator 114-1. Concretely, the first orthogonal transformer 114-3 orthogonally transforms the N pieces of digital signals D(1) to D(N) and generates N pieces of first pseudo-alias signals PAg(1) to PAg(N). The first pseudo-alias signals PAg(1) to PAg(N) are used to compensate the alias signal component corresponding to a gain error.

In the second orthogonal transform path, the N pieces of digital signals D(1) to D(N) pass through the differentiator 114-1 and the second orthogonal transformer 114-5. Concretely, the differentiator 114-1 differentiates the N pieces of digital signals D(1) to D(N). After that, the second orthogonal transformer 114-5 orthogonally transforms an output of the differentiator 114-1 and generates N pieces of second pseudo-alias signals PAs(1) to PAs(N). The second pseudo-alias signals PAs(1) to PAs(N) are used to compensate the alias signal component corresponding to a skew.

The gain controller 116 generates N pieces of first gain control signals GCg(1) to GCg(N) in accordance with a gain error between interleaves by using the first pseudo-alias signals PAg(1) to PAg(N). The gain controller 116 also generates N pieces of second gain control signals GCs(1) to GCs(N) in accordance with a skew between interleaves by using the second pseudo-alias signals PAs(1) to PAs(N).

The alias signal compensator 118 compensates the alias signal component corresponding to the gain error included in the multiplexer output Mout by using the N pieces of first gain control signals GCg(1) to GCg(N) and the multiplexer output Mout. Moreover, the alias signal compensator 118 compensates the alias signal component corresponding to the skew included in the multiplexer output Mout by using the N pieces of second gain control signals GCs(1) to GCs(N) and the multiplexer output Mout. Thereby, the digital output signal Dout which does not include the alias signal component corresponding to the gain error and the alias signal component corresponding to the skew is obtained.

Incidentally, in the second embodiment, the differentiator 114-1 may be provided at a post stage of the second orthogonal transformer 114-5. In this case, the second orthogonal transformer 114-5 orthogonally transforms the N pieces of digital signals D(1) to D(N). After that, the differentiator 114-1 differentiates an output of the second orthogonal transformer 114-5 and generates the N pieces of second pseudo-alias signals PAs(1) to PAs(N).

According to the second embodiment, the first gain control signals GCg(1) to GCg(N) used for compensating the alias signal component corresponding to the gain error and the second gain control signals GCs(1) to GCs(N) used for compensating the alias signal component corresponding to the skew are generated separately. Therefore, in addition to the effect of the first embodiment, the size and the process amount of the pseudo-alias signal generator 114 can be reduced.

(Third Embodiment)

A third embodiment will be described. In the third embodiment, an example of generating a gain control signal in consideration of the correlation between a pseudo-alias signal and a digital output signal will be described. The description similar to that of the foregoing embodiments will not be repeated.

Figure 4:
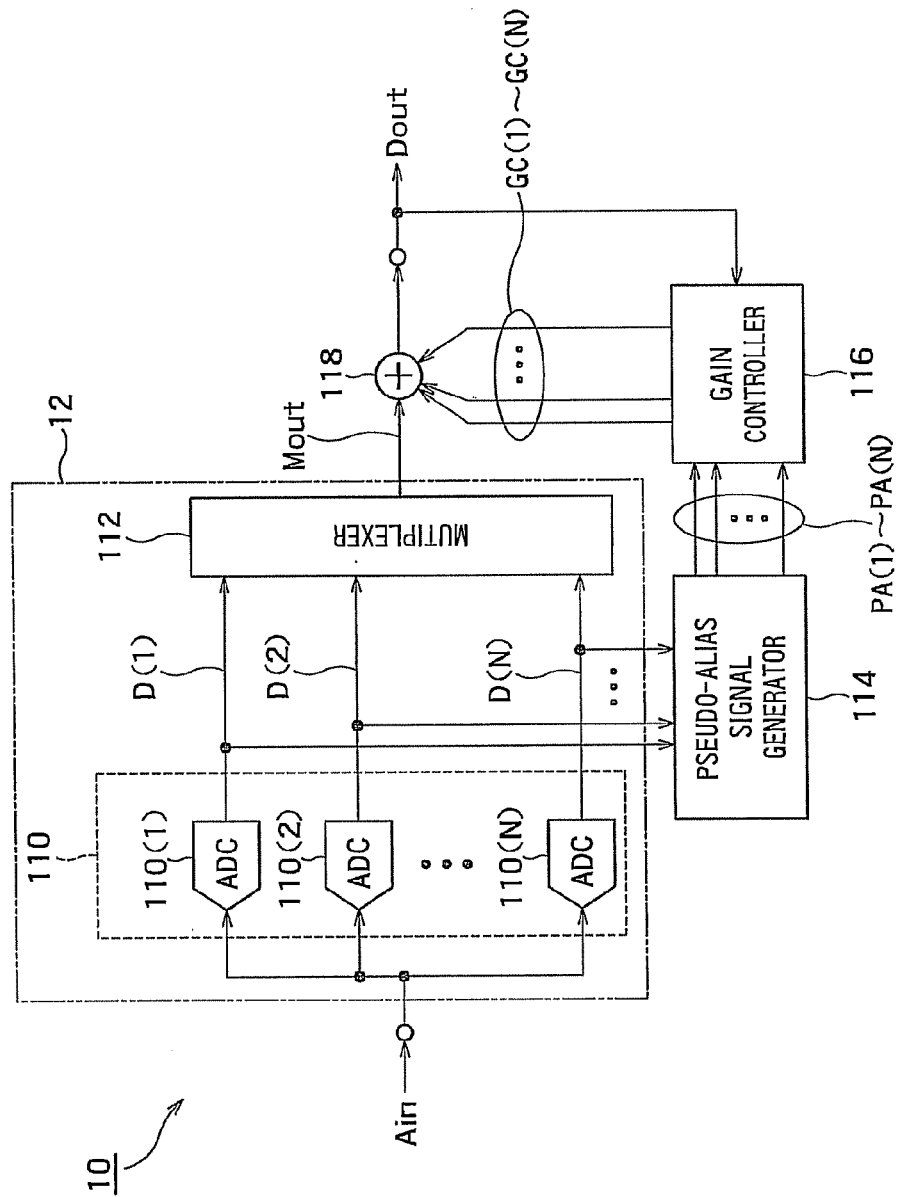
FIG. 4 is a schematic diagram illustrating the configuration of the TI-ADC 10 of the third embodiment.

The configuration of the TI-ADC 10 of the third embodiment will be described. FIG. 4 is a schematic diagram illustrating the configuration of the TI-ADC 10 of the third embodiment.

As illustrated in FIG. 4, the TI-ADC 10 has the analogue-to-digital converting unit 12 (including the analogue-to-digital converter 110 and the multiplexer 112), the pseudo-alias signal generator 114, the gain controller 116, and the alias signal compensator 11.8. By the gain controller 116 and the alias signal compensator 118, a feedback path of the digital output signal Dout is formed. The analogue-to-digital converter 110, the multiplexer 112, the pseudo-alias signal generator 114, and the alias signal compensator 118 are similar to those of the first embodiment.

The gain controller 116 generates N pieces of gain control signals GC(1) to GC(N) in consideration of the correlation between the N pieces of alias signals PA(1) to PA(N) and the digital output signal Dout.

Figure 5:
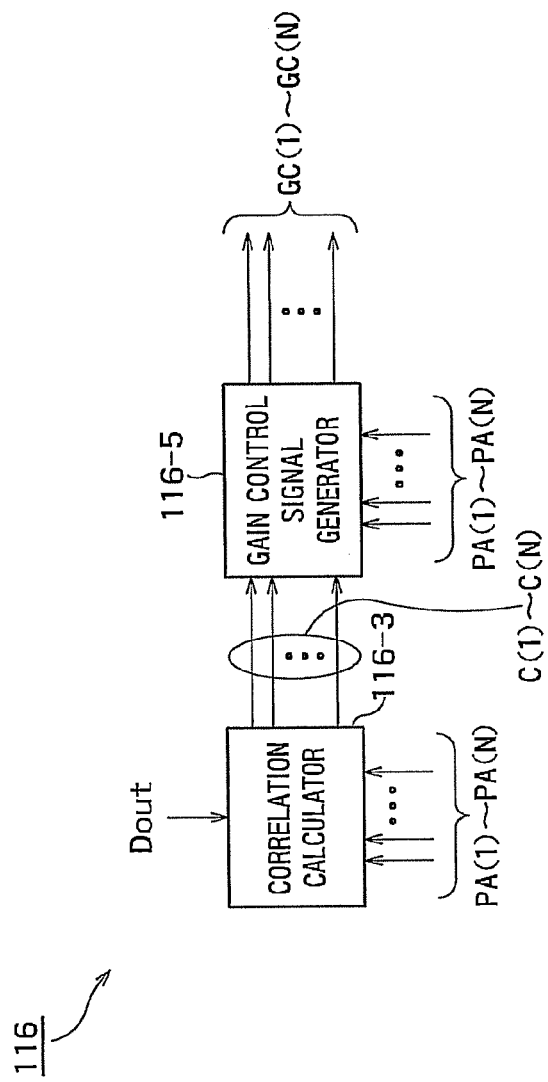
FIG. 5 is a block diagram illustrating the configuration of the gain controller 116 of the third embodiment.
Figure 6:
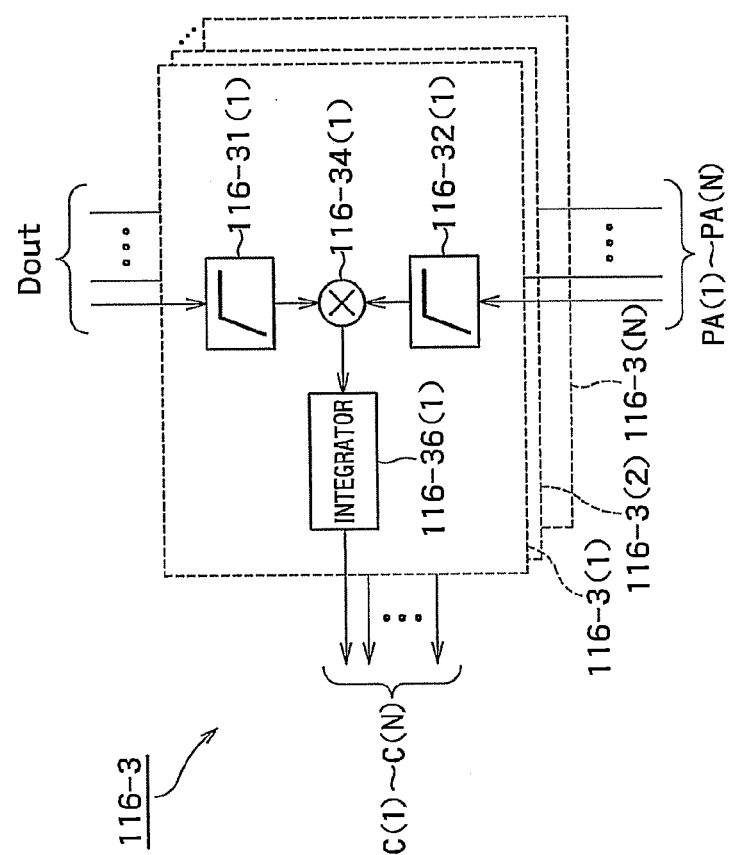
FIG. 6 is a block diagram illustrating the configuration of a correlation calculator 116-3 of the third embodiment.

The configuration of the gain controller 116 of the third embodiment will be described. FIG. 5 is a block diagram illustrating the configuration of the gain controller 116 of the third embodiment. FIG. 6 is a block diagram illustrating the configuration of a correlation calculator 116-3 of the third embodiment.

As shown in FIG. 5, the gain controller 116 has the correlation calculator 116-3 and a gain control signal generator 116-5.

The correlation calculator 116-3 receives the N pieces of pseudo-alias signals PA(1) to PA(N) generated by the pseudo-alias signal generator 114, calculates the correlation between the N pieces of pseudo-alias signals PA(1) to PA(N) and the digital output signal Dout, and generates N pieces of correlation signals C(1) to C(N) expressing the calculated correlation. That is, the correlation signal C(n) expresses the correlation between the pseudo-alias signal PA(n) and the digital output signal Dout.

As shown in FIG. 6, the correlation calculator 116-3 has N pieces of correlation calculation units 116-3(1) to 116-3(N). Each of the correlation calculation units 116-3($n$) has a first HPF (high pass filter) 116-31($n$), a second HPF 116-32($n$), a multiplier 116-34($n$), and an integrator 116-36($n$).

The first HPF 116-31($n$) eliminates a low frequency band in the digital output signal Dout and makes a high frequency band in the digital output signal Dout pass. The second HPF 116-32($n$) eliminates a low frequency band in the pseudo-alias signal PA(n) and makes a high frequency band in the pseudo-alias signal PA(n) pass. The multiplier 116-34($n$) multiplies an output of the first HPF 116-31($n$) (that is, the high frequency band in the digital output signal Dout) with an output of the second HPF 116-32($n$) (that is, the high frequency band in the pseudo alias signal PA(n)). The integrator 116-36($n$) time-integrates an output of the multiplier 116-34($n$). Thereby, the correlation signal C(n) is obtained. That is, the correlation signal C(n)[x] is expressed by the equation (2). In the equation (2), x denotes a sample sequence, Dout'(n)[x] denotes an output of the first HPF 116-31($n$), PA'(n)[x] denotes an output of the second HPF 116-32($n$), μ denotes step size, Z=exp(jωTs), and ω denotes angular frequency.

$$C(n)[x] = \frac{\mu}{1 - Z^{-1}}(Dout'(n)[x] \times PA'(n)[x]) \quad \text{Equation (2)}$$

The gain control signal generator 116-5 multiplies the correlation signals C(1) to C(N) with the pseudo-alias signals PA(1) to PA(N) and generates the gain control signals GC(1) to GC(N), respectively. That is, the gain control signal GC(n) is "C(n)×PA(n)".

According to the third embodiment, by the feedback path of the digital output signal Dout and the gain controller 116 formed by the correlation calculator 116-3 and the gain control signal generator 116-5, the gain control signals GC(1) to GC(N) in which the correlation between the pseudo-alias signals PA(1) to PA(N) and the digital output signal Dout is considered are obtained. The correlation calculator 116-3 is realized by simple modules (the first HPF 116-31, the second HPF 116-32, the multiplier 116-34, and the integrator 116-36). Therefore, in addition to the effects of the foregoing embodiments, the circuit scale of the gain controller 116 can be further reduced.

(Fourth Embodiment)

A fourth embodiment will be described. In the fourth embodiment, a modification of the gain controller of the third embodiment will be described. The description similar to the foregoing embodiments will not be repeated.

Figure 7:
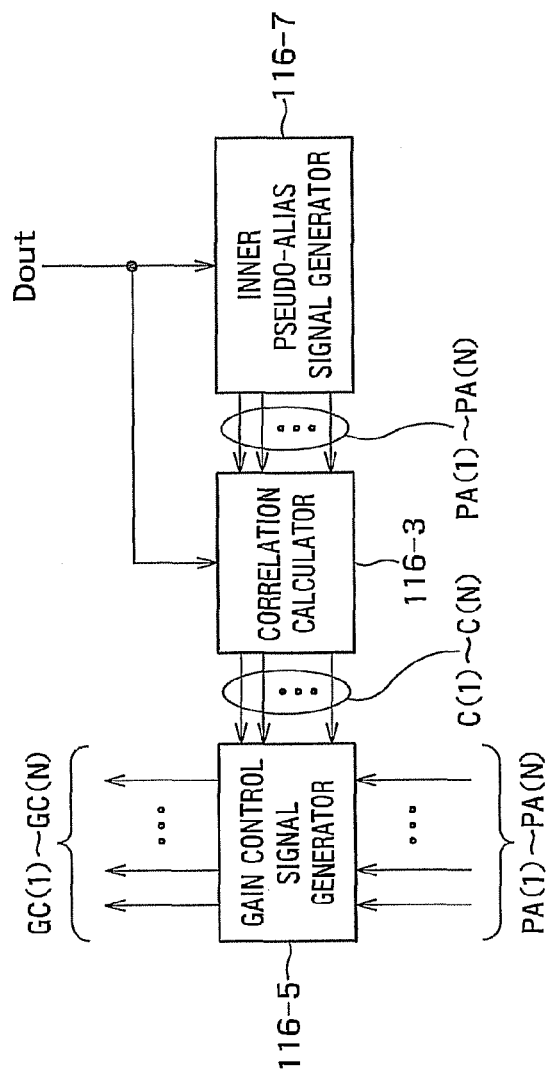
FIG. 7 is a block diagram illustrating the configuration of the gain controller 116 of the fourth embodiment.

The configuration of the gain controller 116 of the fourth embodiment will be described. FIG. 7 is a block diagram illustrating the configuration of the gain controller 116 of the fourth embodiment.

As shown in FIG. 7, the gain controller 116 has the correlation calculator 116-3, the gain control signal generator 116-5, and an inner pseudo-alias signal generator 116-7. The gain control signal generator 116-5 is similar to that of the third embodiment.

The inner pseudo-alias signal generator 116-7 operates in a manner similar to the pseudo-alias signal generator 114. Thereby, N pieces of pseudo-alias signals PA(1) to PA(N) are obtained in the gain controller 116.

The correlation calculator 116-3 receives the N pieces of pseudo-alias signals PA(1) to PA(N) generated by the inner pseudo-alias signal generator 116-7 and calculates the correlation between the N pieces of pseudo-alias signals PA(1) to PA(N) and the digital output signal Dout. The configuration of the correlation calculator 116-3 is similar to that of the third embodiment. Outputs of the correlation calculator 116-3 are N pieces of correlation signals C(1) to C(N) expressing the calculated correlation. The correlation signal C(n) expresses the correlation between the pseudo-alias signal PA(n) and the digital output signal Dout.

According to the fourth embodiment, only from the digital output signal Dout, the gain control signals GC(1) to GC(N) in which the correlation between the pseudo-alias signals PA(1) to PA(N) and the digital output signal Dout is considered are obtained. Therefore, in addition to the effects of the foregoing embodiments, the gain control signals GC(1) to GC(N) with higher precision are obtained.

(Fifth Embodiment)

A fifth embodiment will be described. In the fifth embodiment, an example of supplying a signal in which an alias signal component has been compensated to a multiplexer will be described. The description similar to the foregoing embodiments will not be repeated.

Figure 8:
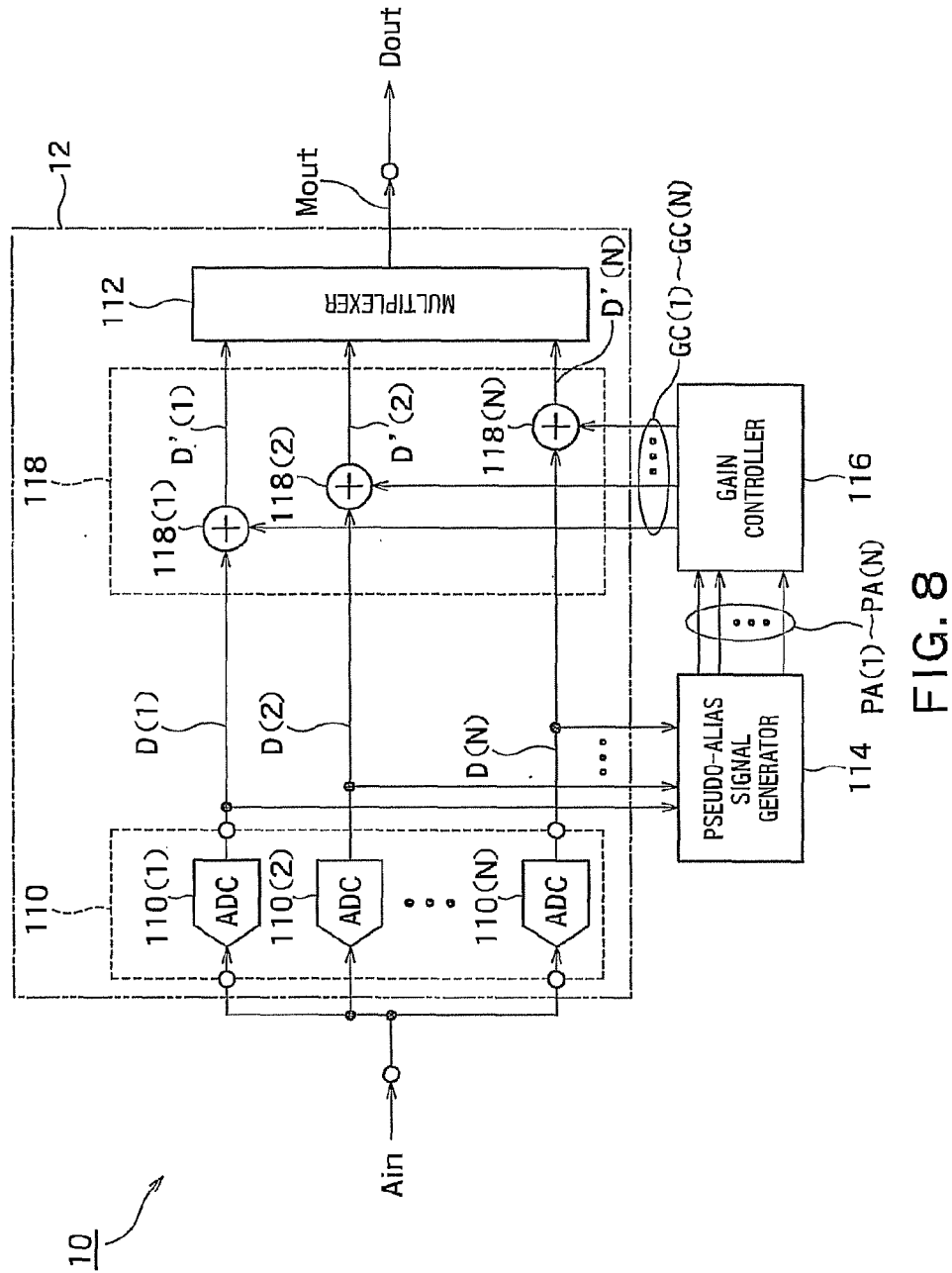
FIG. 8 is a schematic diagram illustrating the configuration of the TI-ADC 10 of the fifth embodiment.

The configuration of the TI-ADC 10 of the fifth embodiment will be described. FIG. 8 is a schematic diagram illustrating the configuration of the TI-ADC 10 of the fifth embodiment.

As illustrated in FIG. 8, the TI-ADC 10 has the analogue-to-digital converting unit 12 (including the analogue-to-digital converter 110, the multiplexer 112, and the alias signal compensator 118), the pseudo-alias signal generator 114, and the gain controller 116. The analogue-to-digital converter 110, the pseudo-alias signal generator 114, and the gain controller 116 are similar to those of the first embodiment. It is difference from the first embodiment that the pseudo-alias signal generator 114, the gain controller 116, and the alias signal compensator 118 operate at the operation frequency Fs/N which is 1/N of the sample frequency Fs.

The alias signal compensator 118 is provided between the analogue-to-digital converter 110 and the multiplexer 112. The alias signal compensator 118 compensates an alias signal component which may be included in the multiplexer output Mout by adding a plurality of gain control signals GC(1) to GC(N) to N pieces of digital signals D(1) to D(N) before the multiplexer output Mout is generated. As an example, the alias signal compensator 118 has N pieces of adders 118(1) to 118(N). The adder 118(n) adds the gain control signal GC(n) to the digital signal D(n). As a result, a digital signal D'(n) which does not include the alias signal component is obtained. A digital signal D'(n)[x] at arbitrary time obtained by the alias signal compensator 118 is expressed by the equation (3). In the equation (3), x denotes a sample sequence, D(n)[x] denotes an output of the ADC 110(n), and GC(n)[x] denotes a signal level of the gain control signal GC(n).

$$D'(n)[x]=D(n)[x]+GC(n)[x] \quad \ldots \text{Equation (3)}$$

The multiplexer 112 sequentially selects one digital signal D'(n) from the N pieces of digital signals D'(1) to D'(N) at intervals of the sample cycle Ts and outputs the selected digital signal D'(n) as a multiplexer output Mout. The multiplexer output Mout is supplied to the DSP 30 as a digital output signal Dout. The multiplexer output Mout (that is, the digital output signal Dout) changes every sample cycle Ts. Thereby, the digital output signal Dout which does not include alias signal component is obtained.

According to the fifth embodiment, the alias signal compensator 118 is provided between the analogue-to-digital converter 110 and the multiplexer 112 (that is, on the prior stage to the multiplexer 112). The pseudo-alias signal generator 114, the gain controller 116, and the alias signal compensator 118 operate at the operation frequency Fs/N. Therefore, in addition to the effect of the foregoing embodiments, power consumption of the TI-ADC 10 is further reduced, and the processing speed can be increased.

(Sixth Embodiment)

A sixth embodiment will be described. In the sixth embodiment, an example of generating N pieces of pseudo-alias signals from one multiplexer output will be described. The description similar to the foregoing embodiments will not be repeated.

Figure 9:
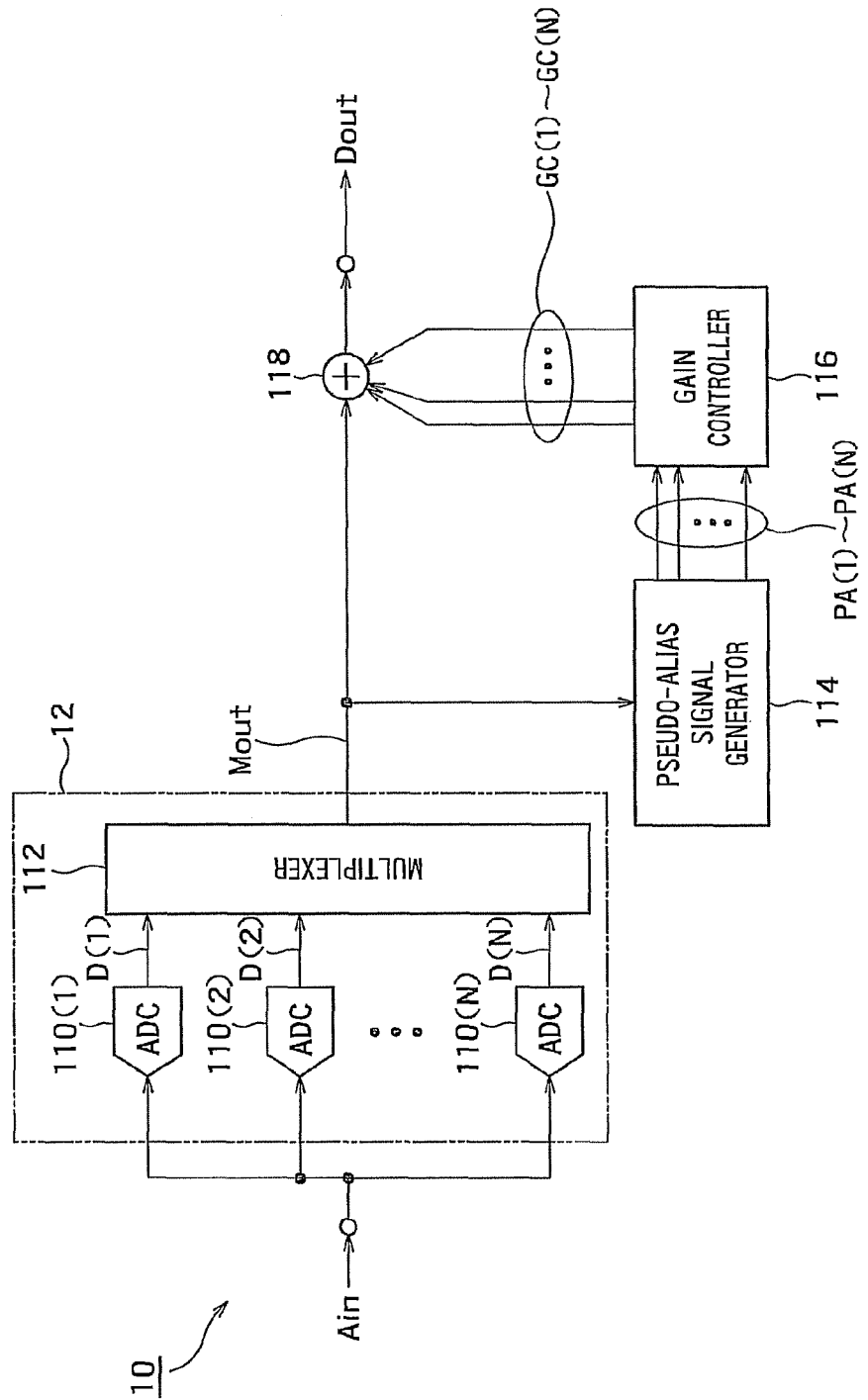
FIG. 9 is a schematic diagram illustrating the configuration of the TI-ADC 10 of the sixth embodiment.

The configuration of the TI-ADC 10 of the sixth embodiment will be described. FIG. 9 is a schematic diagram illustrating the configuration of the TI-ADC 10 of the sixth embodiment.

As illustrated in FIG. 9, the TI-ADC 10 has the analogue-to-digital converting unit 12 (including the analogue-to-digital converter 110 and the multiplexer 112), the pseudo-alias signal generator 114, the gain controller 116, and the alias signal compensator 118. The multiplexer output Mout is supplied to the pseudo-alias signal generator 114 and the alias signal compensator 118. The analogue-to-digital converter 110, the multiplexer 112, and the alias signal compensator 118 are similar to those of the first embodiment.

The pseudo-alias signal generator 114 generates N pieces of pseudo-alias signals PA(1) to PA(N) from the multiplexer output Mout. The pseudo alias signal PA(n) simulates the alias signal component included in a composite signal (for example, the multiplexer output Mout) which is obtained by synthesizing a plurality of digital signals D(1) to D(N) and handled in the analogue-to-digital converting unit 12.

Figure 10:
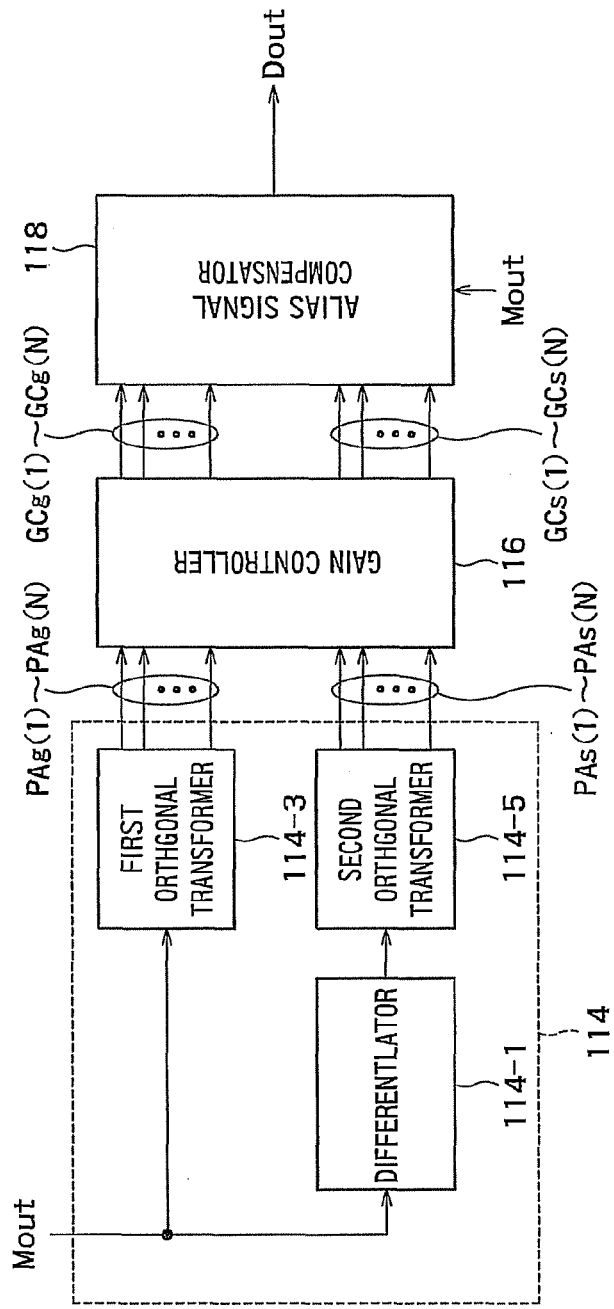
FIG. 10 is a block diagram explaining the pseudo-alias signal generator 114, the gain controller 116, and the alias signal compensator 118 of the sixth embodiment.

The configuration of the pseudo-alias signal generator 114 of the sixth embodiment will be described. FIG. 10 is a block diagram explaining the pseudo-alias signal generator 114, the gain controller 116, and the alias signal compensator 118 of the sixth embodiment.

As shown in FIG. 10, the pseudo-alias signal generator 114 has the differentiator 114-1, the first orthogonal transformer 114-3, and the second orthogonal transformer 114-5. The pseudo-alias signal generator 114 is provided with a first orthogonal transform path and a second orthogonal transform path.

In the first orthogonal transform path, the multiplexer output Mout passes through the first orthogonal transformer 114-3 without passing through the differentiator 114-1. Concretely, the first orthogonal transformer 114-3 orthogonally transforms the multiplexer output Mout and generates N pieces of first pseudo-alias signals PAg(1) to PAg(N). The first pseudo-alias signals PAg(1) to PAg(N) are used to compensate the alias signal component corresponding to a gain error.

In the second orthogonal transform path, the multiplexer output Mout passes through the differentiator 114-1 and the second orthogonal transformer 114-5. Concretely, the differentiator 114-1 differentiates the multiplexer output Mout. After that, the second orthogonal transformer 114-5 orthogonally transforms an output of the differentiator 114-1 and generates N pieces of second pseudo-alias signals PAs(1) to PAs(N). The second pseudo-alias signals PAs(1) to PAs(N) are used to compensate the alias signal component corresponding to a skew.

According to the sixth embodiment, the differentiator 114-1 generates an input signal of the second orthogonal transformer 114-5 from the multiplexer output Mout. That is, a configuration of the differentiator 114-1 is an one-input and one-output. Therefore, in addition to the effects of the foregoing embodiments, the size and the process amount of the differentiator 114-1 can be reduced.

Incidentally, the inner pseudo-alias signal generator 116-7 of the fourth embodiment may generate N pieces of pseudo-alias signals PA(1) to PA(N) from the multiplexer output Mout like the pseudo-alias signal generator 114 of the sixth embodiment.

As described above, in the embodiment, the analogue-to-digital converting unit 12 converts the analogue input signal Ain to at least one digital signal (the digital signals D(1) to D(N) or the multiplexer output Mout). The pseudo-alias signal generator 114 generates a pseudo-alias signal PA from the digital signal. The gain controller 116 generates the gain control signal GC by using the pseudo-alias signal PA. The alias signal compensator 118 compensates the alias signal component by using the gain control signal GC.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An analogue to digital converter configured to convert an analogue input signal to a digital output signal, the converter comprising:

an analogue to digital converting unit configured to convert the analogue input signal to a plurality of digital signals;

a multiplexer configured to sequentially select one of the digital signals and to output the selected digital signal as a multiplexer output;

a pseudo-alias signal generator configured to generate a plurality of pseudo-alias signals from the digital signals, the pseudo-alias signal simulating an alias signal component in the multiplexer output;

a gain controller configured to generate a plurality of gain control signals by using the pseudo-alias signals, the gain control signal controlling gain of the digital output signal; and an alias signal compensator configured to compensate the alias signal component by using the gain control signals.

2. The converter of claim 1, wherein the pseudo-alias signal generator comprises:

a first orthogonal transform path in which a plurality of first pseudo-alias signals is generated by orthogonally transforming the digital signals; and a second orthogonal transform path in which a plurality of second pseudo-alias signals is generated by differentiating and orthogonally transforming the digital signals, wherein the gain controller generates:

a plurality of first gain control signals in accordance with a gain error between interleaves by using the first pseudo-alias signals; and a plurality of second gain control signals in accordance with a skew between interleaves by using the second pseudo-alias signals, and wherein the alias signal compensator compensates:

a first alias signal component corresponding to the gain error in the multiplexer output by using the first gain control signals and the multiplexer output; and a second alias signal component corresponding to the skew in the multiplexer output by using the second gain control signals and the multiplexer output.

3. The converter of claim 2, wherein the gain controller generates the gain control signals in consideration of correlation between the pseudo alias signals and the digital output signal.

4. The converter of claim 3, wherein the gain controller comprises:

a correlation calculator configured to generate a plurality of correlation signals, the correlation signal expressing correlation between the pseudo-alias signal and the multiplexer output; and a gain control signal generator configured to generate the gain control signals by multiplexing the correlation signals with the pseudo alias signals.

5. The converter of claim 4, wherein the gain controller further comprises an inner pseudo-alias signal generator configured to generate the pseudo-alias signals from the digital signals, and the correlation calculator generates a plurality of correlation signals, the correlation signal expressing correlation between the pseudo-alias signal generated by the inner pseudo-alias signal generator and the multiplexer output.

6. The converter of claim 1, wherein the gain controller generates the gain control signals in consideration of correlation between the pseudo alias signals and the digital output signal.

7. The converter of claim 6, wherein the gain controller comprises:

a correlation calculator configured to generate a plurality of correlation signals, the correlation signal expressing correlation between the pseudo-alias signal and the multiplexer output; and a gain control signal generator configured to generate the gain control signals by multiplexing the correlation signals with the pseudo alias signals.

8. The converter of claim 7, wherein the gain controller further comprises an inner pseudo-alias signal generator configured to generate the pseudo-alias signals from the digital signals, and the correlation calculator generates a plurality of correlation signals, the correlation signal expressing correlation between the pseudo-alias signal generated by the inner pseudo-alias signal generator and the multiplexer output.

9. The converter of claim 7, wherein the correlation calculator comprises:

a first high pass filter configured to pass a high frequency band in the multiplexer output;

a second high pass filter configured to pass a high frequency band in the pseudo-alias signal;

a multiplier configured to multiply an output of the first high pass filter with an output of the second high pass filter; and an integrator configured to integrate an output of the multiplier.

10. The converter of claim 1, wherein the alias signal compensator is provided at a post stage of the multiplexer.

11. The converter of claim 10, wherein the alias signal compensator compensates the alias signal component in the multiplexer output by adding the gain control signals to the multiplexer output.

12. The converter of claim 1, wherein the alias signal compensator is provided between the analogue to digital converting unit and the multiplexer.

13. The converter of claim 12, wherein the alias signal compensator compensates the alias signal component in the digital signals by adding the gain control signals to the digital signals.

14. The converter of claim 1, wherein the pseudo-alias signal generator applies orthogonal transform on the digital signals.

15. The converter of claim 14, wherein the pseudo-alias signal generator applies Hadamard-transform on the digital signals.

16. An analogue to digital converter configured to convert an analogue input signal to a digital output signal, the converter comprising:

an analogue to digital converting unit configured to convert the analogue input signal to a plurality of digital signals;

a pseudo-alias signal generator configured to generate a pseudo-alias signal simulating an alias signal component in a synthetic signal obtained by synthesizing the digital signals;

a gain controller configured to generate a gain control signal by using the pseudo-alias signal, the gain control signal controlling gain of the digital output signal; and an alias signal compensator configured to compensate the alias signal component by using the gain control signal.

17. The converter of claim 16, wherein the pseudo-alias signal generator comprises:

a first orthogonal transform path in which a plurality of first pseudo-alias signals is generated by orthogonally transforming the digital signals; and a second orthogonal transform path in which a plurality of second pseudo-alias signals is generated by differentiating and orthogonally transforming the digital signals, wherein the gain controller generates:

a plurality of first gain control signals in accordance with a gain error between interleaves by using the first pseudo-alias signals; and a plurality of second gain control signals in accordance with a skew between interleaves by using the second pseudo-alias signals, and wherein the alias signal compensator compensates:

a first alias signal component corresponding to the gain error in the multiplexer output by using the first gain control signals and the multiplexer output; and a second alias signal component corresponding to the skew in the multiplexer output by using the second gain control signals and the multiplexer output.

18. The converter of claim 16, wherein the gain controller generates the gain control signals in consideration of correlation between the pseudo alias signals and the digital output signal.

19. The converter of claim 18, wherein the gain controller generates the gain control signals in consideration of correlation between the pseudo alias signals and the digital output signal.

20. A signal processing system comprising:

a base band filter configured to filter an input signal and to generate an analogue input signal;

an analogue to digital converter configured to convert the analogue input signal to a digital output signal; and a digital signal processor configured to perform signal process on the digital output signal, wherein the analogue to digital converter comprises:

an analogue to digital converting unit configured to convert the analogue input signal to a plurality of digital signals;

a pseudo-alias signal generator configured to generate a pseudo-alias signal simulating an alias signal component in a synthetic signal obtained by synthesizing the digital signals;

a gain controller configured to generate a gain control signal by using the pseudo-alias signal, the gain control signal controlling gain of the digital output signal; and an alias signal compensator configured to compensate the alias signal component by using the gain control signal.

* * * * *